United States Patent
Roqan et al.

(10) Patent No.: US 11,208,333 B2
(45) Date of Patent: Dec. 28, 2021

(54) SYNTHESIS OF VERTICALLY ALIGNED METAL OXIDE NANOSTRUCTURES

(71) Applicant: KING ABDULLAH UNIVERSITY OF SCIENCE AND TECHNOLOGY, Thuwal (SA)

(72) Inventors: Iman Roqan, Thuwal (SA); Tahani Hassan Flemban, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 413 days.

(21) Appl. No.: 15/506,415

(22) PCT Filed: Aug. 20, 2015

(86) PCT No.: PCT/IB2015/001560
§ 371 (c)(1),
(2) Date: Feb. 24, 2017

(87) PCT Pub. No.: WO2016/030746
PCT Pub. Date: Mar. 3, 2016

(65) Prior Publication Data
US 2018/0222766 A1    Aug. 9, 2018

Related U.S. Application Data

(60) Provisional application No. 62/041,833, filed on Aug. 26, 2014.

(51) Int. Cl.
*C01G 9/03*    (2006.01)
*C23C 14/08*    (2006.01)
(Continued)

(52) U.S. Cl.
CPC .............. *C01G 9/03* (2013.01); *C01G 1/02* (2013.01); *C23C 14/086* (2013.01); *C23C 14/28* (2013.01);
(Continued)

(58) Field of Classification Search
None
See application file for complete search history.

(56) References Cited

U.S. PATENT DOCUMENTS 5,897,945 A * 4/1999 Lieber .................... C30B 23/00
428/323
2008/0292808 A1    11/2008 Liu

FOREIGN PATENT DOCUMENTS

WO    WO2009/106828    9/2009
WO    WO 2014/072829    5/2014

OTHER PUBLICATIONS

Abeer, Alarawi "Structural and optical properties of Eu Doped ZnO Nanorods prepared by Pulsed Laser Deposition (PLD)". Jun. 23, 2014. (Year: 2014).*

(Continued)

Primary Examiner — Mandy C Louie
(74) Attorney, Agent, or Firm — Patent Portfolio Builders PLLC

(57) ABSTRACT

Metal oxide nanostructure and methods of making metal oxide nanostructures are provided. The metal oxide nanostructures can be 1-dimensional nanostructures such as nanowires, nanofibers, or nanotubes. The metal oxide nanostructures can be doped or un-doped metal oxides. The metal oxide nanostructures can be deposited onto a variety of substrates. The deposition can be performed without high pressures and without the need for seed catalysts on the substrate. The deposition can be performed by laser ablation of a target including a metal oxide and, optionally, a dopant. In some embodiments zinc oxide nanostructures are depos- (Continued)

ited onto a substrate by pulsed laser deposition of a zinc oxide target using an excimer laser emitting UV radiation. The zinc oxide nanostructure can be doped with a rare earth metal such as gadolinium. The metal oxide nanostructures can be used in many devices including light-emitting diodes and solar cells.

16 Claims, 8 Drawing Sheets

(51) Int. Cl.
 *C23C 14/28* (2006.01)
 *C01G 1/02* (2006.01)
 *H01G 9/20* (2006.01)
 *H01L 21/02* (2006.01)
 *B82Y 30/00* (2011.01)
 *B82Y 40/00* (2011.01)

(52) U.S. Cl.
 CPC ......... *H01G 9/204* (2013.01); *H01L 21/0242* (2013.01); *H01L 21/02381* (2013.01); *H01L 21/02554* (2013.01); *H01L 21/02606* (2013.01); *H01L 21/02631* (2013.01); *B82Y 30/00* (2013.01); *B82Y 40/00* (2013.01); *C01P 2002/54* (2013.01); *C01P 2002/72* (2013.01); *C01P 2002/85* (2013.01); *C01P 2004/03* (2013.01); *C01P 2004/04* (2013.01); *C01P 2004/13* (2013.01); *C01P 2004/16* (2013.01); *C01P 2006/40* (2013.01); *Y10S 977/762* (2013.01); *Y10S 977/811* (2013.01); *Y10S 977/891* (2013.01)

(56) References Cited

OTHER PUBLICATIONS

Email regarding publication date of reference Abeer thesis from Scientific and Technical Information Center (STIC) (Year: 2020).*

Haas et al "Molecular Beam Epitaxial Growth and Doping Studies of In2O3 Fills on ZrO2:Y(111) and In2O3(111)" Uni Freiburg Jan. 2014 (Year: 2014).*
Gomez, J. L., et al.; "Zinc oxide nanostructures: from growth to application"; Journal of Materials Science vol. 48, Issue 2; Jan. 2013; pp. 612-624.
Lee, C.J., et al.; "Field emission from well-aligned zinc oxide nanowires grown at low temperature"; Applied Physics Letters, vol. 81, No. 19; Nov. 4, 2002; pp. 3648-3650.
Lin, C. F., et al.; "Characterization of the well-aligned ZnO nanorod structure on a pulsed laser deposited AlZnO seed layer"; Surface & Coatings Technology, vol. 231 (2013); published online Jul. 10, 2012; pp. 162-165.
Lorenz, M., et al.; "MgxZn1-xO(0<X<0.2) nanowire arrays on sapphire grown by high-pressure pulsed-laser deposition"; Applied Physics Letters vol. 86; Mar. 31, 2005; pp. 143113-1 to 143113-3.
Özgür, Ü, et al.; "A comprehensive review of ZnO materials and devices"; Journal of Applied Physics; vol. 98, Aug. 2005; 104 pages.
Premkumar, T., et al.; "Optical and Field-emission Properties of ZnO Nanostructures Deposited Using High-Pressure Pulsed Laser Deposition"; Applied Materials & Interfaces, vol. 2, No. 10; Sep. 30, 2010; 7 pages.
Varanasi, C. V., et al.; "Improved photoluminescence of vertically aligned ZnO nanorods grown on BaSrTiO3 by pulsed laser deposition"; Nanotechnology vol. 20; Aug. 28, 2009; pp. 1-6.
Willander, M., et al.; "Zinc oxide nanorod based photonic devices: recent progress in growth, light emitting diodes and lasers"; Nanotechnology, vol. 20; Jul. 28, 2009; pp. 1-40.
International Search Report and Written Opinion of Application No. PCT/IB2015/001560 dated Dec. 17, 2015, 12 pages.
S. S. Lin et al: "Phosphorus Doped Zn 1-x Mg x 0 Nanowire Arrays", NANO Letters, vo 1 • 9. No. 11, Nov. 11, 2009 (Nov. 11, 2009), pp. 3877-3882, XP055234083.
Liu et al: "Synthesis and size control of ZnO nanorods by conventional pulsed-laser deposition without catalyst", Materials Letters, North Holland Publishing Company. Amsterdam, NL, vol. 61, No. 16, Jun. 1, 2007 (Jun. 1, 2007), pp. 3329-3333, XP022079086.

* cited by examiner

SYNTHESIS OF VERTICALLY ALIGNED METAL OXIDE NANOSTRUCTURES

CROSS-REFERENCE TO RELATED APPLICATION

This application is the National Stage of International Application No. PCT/IB2015/001560, filed 20 Aug. 2015, which claims the benefit of and priority to U.S. Provisional Application Ser. No. 62/041,833, having the title "SYNTHESIS OF VERTICALLY ALIGNED METAL OXIDE NANOSTRUCTURES," filed on 26 Aug. 2014, the entire disclosures of which are incorporated by reference in their entireties as if fully set forth herein.

FIELD OF THE DISCLOSURE

This disclosure is generally in the field of synthesis of nanostructures, in particular, synthesis of metal oxide nanostructures.

BACKGROUND

Efficient size and shape controlled synthesis of nanostructures remains challenging for the nano-scale research field, especially in the synthesis of well-ordered nanostructures. Nanostructured materials have many advantages over bulk materials for many technologies; such as higher surface-to-volume ratios, better quantum confinement effect, less scattering of the carrier, and higher mobility compared to their bulk counterparts. These extraordinary properties of semiconducting oxide nanowires have led many researchers to pursue synthesis, doping, and new device applications, due to their potential use in high-performance nanoscale electronic and optoelectronic devices operating at high temperature (above room temperature) (Willander, et al., *Nanotechnology* 20(33):1-40, 2009).

Metal oxides such as Zinc oxide (ZnO) are promising materials for many potential applications; e.g. sensors, solar and optoelectronic devices. ZnO is a direct wide band gap (3.37 eV) semiconductor. It is also known as piezoelectric material with potential properties for sensing applications. Its high exciton binding energy of 60 meV makes it a promising photonic material for devices operating at room temperature (Ozgur et al., *Journal of Applied Physics* 98(4):1-103, 2005.). Therefore, nanostructured ZnO, in particular nanowires and nanotubes, were extensively investigated because their unique features are promising for a wide range of applications, including electronic (e.g., nanowire-based field-effect transistors (FETs) and solar cells and sensors), optoelectronic (e.g., light emitting diodes (LEDs), laser diodes and vacuum electron field emitters). One-dimensional nanostructures, such as nanotubes (NTs) and nanowires (NWs), are good candidates for achieving high field emission current density at a low field because of their high aspect ratio (Lee et al., *Applied Physics Letters* 81(19):3648-3650, 2002). However, integrating NWs and NTs on a chip remains a challenge.

Previous attempts to produce ZnO nanowire by pulsed laser depositions (PLD) have been either by modifying the PLD chamber to work in a high pressure (5-20 Torr) (Liu and Ong, *Materials Letters* 61(16):3329-3333, 2007; Premkumar et al., *ACS Applied Materials & Interfaces* 2(10):2863-2869, 2010; Willander, et al. *Nanotechnology* 20(33):1-40, 2009) or by using seeded growth catalysts (Gomez and Tigli, *Journal of Materials Science* 48(2):612-624, 2013; Lin et al., *Surface & Coatings Technology* 231:161-165, 2013; Lorenz et al., *Applied Physics Letters* 86(14):1-3, 2005; Varanasi et al., *Nanotechnology* 20(38):1-5, 2009). U.S. Pat. No. 8,691,012 to Cha et al. describes manufacturing ZnO nanowires using a metal seed layer formed on a substrate. The metal seed layer is thermally oxidized to form metal oxide crystals. Zinc oxide nanowires are grown on the metal oxide crystals serving as seeds for growth. CN 101413141 describes a PLD method for growing a ZnO nanometer wire array by modifying the PLD chamber for a high pressure (several Torr) and depositing a seed layer on the substrate. Lin et al., describe growing ZnO nanorods on InGaN light emitting diode (LED) structure by using an aluminum zinc oxide (AZO) seed layer (Lin et al., *Surface & Coatings Technology* 231:161-165, 2013). ZnMgO nanowire arrays have been grown by PLD under high pressure argon and oxygen (Lin et al., *Nano Letters* 9(11):3877-3882, 2009). Varanasi et al. has also described growing ZnO nanorods on sapphire using Cr or BaSrTiO$_3$ seed layers (Varanasi et al., *Nanotechnology* 20(38):1-5, 2009).

There remains a need for methods to produce well-defined and ordered nanostructures without the need for high pressure manufacturing processes and without requiring seeded growth of the nanostructures.

SUMMARY

Metal oxide nanostructures and methods of making metal oxide nanostructures are provided. The methods include the deposition of the metal oxide onto a substrate without the need for high pressures and without the need for a catalyst seed. The methods include ablating a target containing a metal oxide with a laser beam to create a plume that is deposited on a substrate. The method can produce nanostructures that are vertically-aligned and/or well-defined. In some embodiments the metal oxide nanostructures are zinc oxide nanostructures, optionally containing a dopant. The metal oxide nanostructures can be used in devices, for example as transparent electrodes, in light-emitting diodes, photovoltaic cells, or chemical sensors.

The deposition can generally be performed at any temperature or pressure that is suitable to produce the well-defined and/or vertically aligned nanostructures on the substrate. The deposition does not require high pressures used in other approaches (a few tens of mTorr is enough). The deposition can be performed under an oxygen atmosphere or under an inert atmosphere, such as under nitrogen or a noble gas environment.

The methods can include pulsed laser deposition (PLD) of a metal oxide to deposit the nanostructure on the substrate. The laser can have a pulse rate of 8-12 Hz. The laser can generally be any laser that produces the frequency and intensity of light to ablate the metal oxide target. The laser can be a UV laser, and in particular can be an excimer laser such as those containing a noble gas and a halogen gas. Suitable noble gases can include argon, krypton, or xenon. Suitable halogen gases can include chloride or fluoride. The laser energy density on the target can be 0.5-10 J/cm$^2$. In various aspects the laser energy density can be 0.7-1.7 J/cm$^2$, 2-3 J/cm$^2$, or 4-6 J/cm$^2$. The pressure of the chamber in which the target material and the substrate are placed can be much lesser than 1 Torr, or even less than 100 mTorr. In various aspects the pressure can be about 50 mTorr to about 200 mTorr. The temperature can be, for example, 500° C.-800° C.

The metal oxide nanostructures can be deposited onto a substrate. The substrate can be positioned at any position relative to the target. In some embodiments the target is positioned below the substrate during the deposition. The substrate can be positioned at a distance greater than 6 cm from the target during the depositing step. In various aspects the distance of the target from the substrate can be 8-10 cm. The substrate can be a crystalline substrate, an amorphous substrate, or a plastic substrate. The deposition does not require seed catalysts for depositing the nanostructures on the substrate. Accordingly, in some embodiments, the substrate can be free of seed catalysts prior to the deposition step. Suitable substrates can include silicon substrates, sapphire substrates, quartz substrates, glass substrates, polymer substrates such as polyethylene terephthalate substrates and polyimide substrates, or ceramic substrates. The substrate can be a crystalline or semi-crystalline substrate having a lattice constant closely matched to a lattice constant of the metal oxide.

The methods can be used to produce a variety of metal oxide nanostructures. The nanostructures can be vertically-aligned and/or well-defined on the substrate. The nanostructures can be nanowires, nanorods, nanotubes, or any other well-defined nanostructure. The nanostructures can have a greatest dimension of between 100 nm and 500 nm. The aspect ratio of the nanostructures can be between 2 and 10. The nanostructures can be present on the surface of the substrate at a low and as well as high density, e.g. 100-200 nanostructures per square micron can be present on the substrate.

The methods can be used to produce pure or essentially pure metal oxide nanostructures or can be used to produce doped metal oxide nanostructures. The metal oxide can be a semiconductor at room temperature. Suitable metal oxides can include titanium oxides, tin oxides, niobium oxides, tantalum oxides, tungsten oxides, or zinc oxides. The metal oxide can contain from 0.1-10 wt % of a dopant. The dopant can be an alkaline earth metal or a rare earth metal. The dopant can be added, for instance, by providing a dopant precursor in the target. Suitable dopant precursors can include an alkaline earth oxide or a rare earth oxide.

In an embodiment we provide, a method of making metal oxide nanostructures. The method can comprise: providing a target comprising a metal oxide; ablating the target with a laser to create a plume containing the metal oxide; and depositing the metal oxide from the plume onto a substrate to produce the metal oxide nanostructures.

In an embodiment we provide, a method of making a device comprising metal oxide nanostructures. The method can comprise: providing a target comprising a metal oxide; ablating the target with a laser to create a plume containing the metal oxide; and depositing the metal oxide from the plume onto a substrate to produce the metal oxide nanostructures.

In any one or more of the embodiments, the target and the substrate can be provided in a chamber and the depositing step can be performed within the chamber at a pressure of less than 1 torr, for example less than 500 mTorr. The depositing step can be performed under an oxygen atmosphere or under an inert atmosphere. The depositing step can be performed at a temperature of 500° C.-800° C., for example at a temperature of 600° C.-700° C. The depositing step can be performed at other pressures and temperatures described herein.

In any one or more aspects of any one or more of the methods, the target can be positioned below the substrate during the depositing step. The distance between the substrate and the target can be greater than 6 cm. The target can be positioned at a distance of 8-10 cm from the substrate during the depositing step. The distance between the target and the substrate can be at other distances described herein. The laser can be an excimer laser comprising a noble gas selected from the group consisting of argon, krypton, and xenon and a halogen gas selected from the group consisting of chloride and fluoride.

In any one or more aspects of any one or more of the methods, the substrate can be free of seed catalysts prior to the deposition step. The substrate can be selected from the group consisting of a crystalline substrate, an amorphous substrate, and a plastic substrate. The substrate can be selected from the group consisting of a silicon substrate, a sapphire substrate, a quartz substrate, a glass substrate, a polyethylene terephthalate substrate, a polyimide substrate, and a ceramic substrate. The substrate can be a crystalline substrate having a lattice constant closely matched to a lattice constant of the metal oxide.

In any one or more aspects of any one or more of the methods, nanostructures can be selected from the group consisting of nanowires, nanorods, and nanotubes. The metal oxide can be a metal oxide semiconductor. The metal oxide semiconductor can comprise a metal selected from the group consisting of titanium, tin, niobium, tantalum, tungsten, and zinc. The metal oxide can be zinc oxide. The metal oxide nanostructure comprises a dopant. The dopant can be selected from the group consisting of alkaline earth metals and rare earth metals. The dopant can be gadolinium.

In any embodiment, a metal oxide nanostructure composition is provided. The metal oxide nanostructure can comprise a substrate and a plurality of metal oxide nanostructures produced by any one or more of the aforementioned embodiments and methods.

In any embodiment, a device is provided. The device can comprise a metal oxide nanostructure composition comprising a substrate and a plurality of metal oxide nanostructures. The metal oxide nanostructures can be produced by any one or more of the aforementioned embodiments and methods. The device can be selected from the group consisting of transparent electrodes, light-emitting diodes, photovoltaic cells, and chemical sensors.

Other systems, methods, features, and advantages of the present disclosure for synthesis of metal oxide nanostructures, will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure.

DETAILED DESCRIPTION

Figures 1A, 1B, 1C, 1D, 1E, 1F:
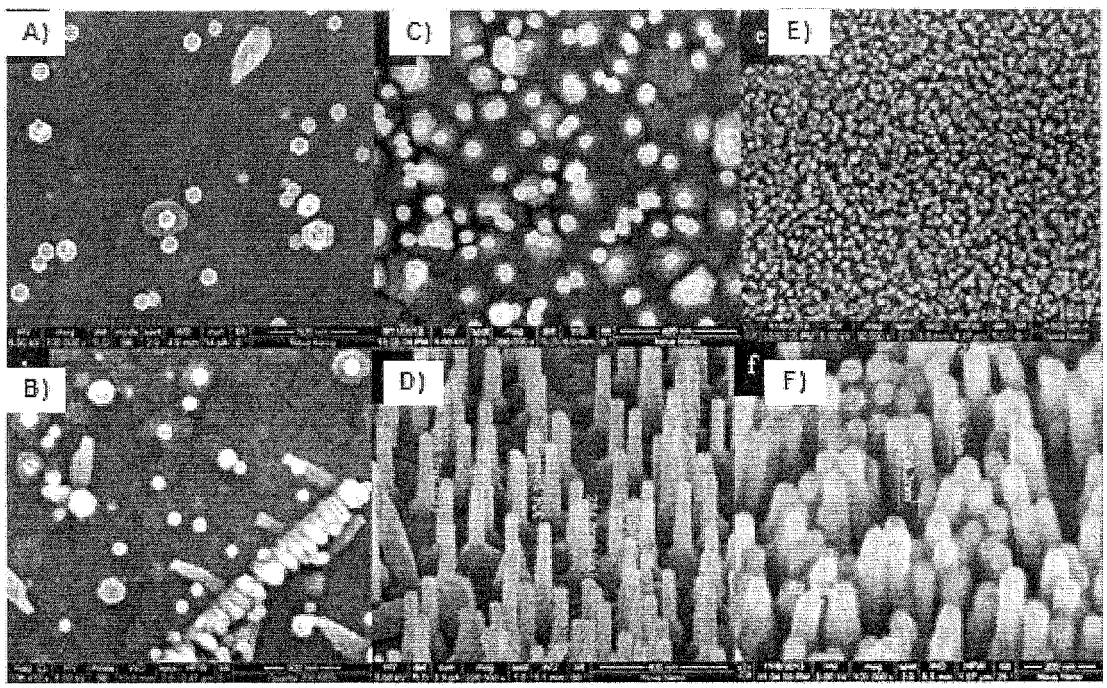
FIGS. 1A-1F are scanning electron microscope (SEM) images of Gd-doped Zinc oxide (ZnO) nanowires obtained in Example 1 at oxygen partial pressures of 50 mTorr (FIGS. 1A and 1B), 100 mTorr (FIGS. 1C and 1D), and 200 mTorr (FIGS. 1E and 1F).

Metal oxide nanostructures and methods of making metal oxide nanostructures are provided herein. Before being described in greater detail, it is to be understood the metal oxide nanostructures and methods of making thereof are not limited to particular embodiments described, and may vary. It is also to be understood that the terminology used is to describe particular embodiments only, and is not intended to be limiting.

I. Metal Oxide Nanostructures

Metal oxide nanostructures are provided. The nanostructures can be generally of any size and dimension, although 1-dimensional structures such as nanowires or nanotubes are preferred. The nanostructures can be made by methods described below. The term "nanostructure", as used herein, refers broadly to structures having at least one, at least two, or at least three dimensions in the nanometer range, e.g. about 1-1,000 nm, 10-1,000 nm, 10-900 nm, 10-800 nm, 10-750 nm, 10-700 nm, 10-650 nm, 10-600 nm, 20-600 nm, 20-500 nm, 50-500 nm, 50-450 nm, 50-400 nm, 50-350 nm, 50-250 nm, 75-250 nm, 100-250 nm, or about 100-200 nm. In some embodiments, the nanostructures have a greatest dimension that is between 100 nm and 1 micron, e.g. 100-800nm, 100-700 nm, 100-600 nm, 100-500 nm, 150-500 nm, 150-400 nm, 150-350 nm, or 150-250 nm.

The nanostructure can be a 1-dimensional (1-D) nanostructure. A 1-D nanostructure can be characterized as having two dimensions that are nanometer range and a third dimension that is significantly longer than the two shorter dimensions. The nanostructure can have a third dimension that is at least 2, 3, 4, 5, 10, or 100 times longer than the two shorter dimensions. The 1D nanostructures will generally have an aspect ratio greater than 2, e.g. greater than 3, 4, 5, or 10. In some embodiments the nanostructures have an aspect ratio of about 1-100, 2-100, 2-80, 2-50, 3-50, 4-50, 5-50, 5-40, 5-30, 5-20, or 5-10. 1-D nanostructures can include nanowires, nanofibers, nanorods, nanotubes, and the like.

The nanostructure can be a nanowire. The term "nanowire", as generally used herein, refers broadly to wires having a diameter in the nanometer range, e.g. a diameter of about 10-250 nm, 10-200 nm, 10-150 nm, 20-150 nm, 20-100 nm, or 40-100 nm. The nanostructure can be a nanorod. The term "nanorod", as generally used herein, refers broadly to rods having a diameter in the nanometer range, e.g. a diameter of about 10-250 nm, 10-200 nm, 10-150 nm, 20-150 nm, 20-100 nm, or 40-100 nm. The nanorods and nanowires are generally distinguished by the aspect ratio, with the nanowires having aspect ratios that are typically larger than that of a nanorod. For example, the nanorods can have an aspect ratio of 2-20, 2-15, 2-10, 3-10, or 3-5 while the nanowires will generally have an aspect ratio that is larger than 5, 10, 20, 50, 100, or even 1,000. The nanowires and nanorods can generally have any length. The nanowires and nanorods can have a length in the nanometer range or in the micrometer range. For example, the nanowires and nanorods can have a length of 100 nm-10 micron, 100 nm-1 micron, 100-800 nm, 150-800 nm, 150-500 nm, or 150-300 nm.

The nanostructure can be a nanotube. The term "nanotube", as generally used herein, refers to hollow tubular structures having a diameter in the nanometer range, e.g. a diameter of 10-250 nm, 20-250 nm, 40-250 nm, 40-200 nm, 40-150 nm, or 40-120 nm. The nanotubes can generally have any length. The nanotubes can have a length in the nanometer range or in the micrometer range. For example, the nanotubes can have a length of 100 nm-10 micron, 100 nm-1 micron, 100-800 nm, 150-800 nm, 150-500 nm, or 150-300 nm.

The nanostructures will generally be present on a substrate. Suitable substrates can include conductive substrates and insulating substrates. The substrate can be a metal, metal oxide, or a polymer substrate. The substrate can be crystalline, amorphous, or plastic. Typical substrates will include, for example, silicon substrates, in particular conductive p-type silicon substrates; sapphire substrates, in particular a-cut sapphire substrates; glass substrates, ceramic substrates; and polymer substrates such as polyimide substrates and polyethylene terephthalate substrates. The nanostructures can be made on substrates having any surface roughness. In some embodiments the substrate has a surface roughness of less than 100 Å, less than 80 Å, less than 60 Å, less than 50 Å, less than 40 Å, less than 35 Å, less than 30 Å, less than 25 Å, less than 20 Å, less than 15 Å, less than 12 Å, less than 10 Å, less than 8 Å, less than 6 Å, less than 4 Å, or less than 2 Å. The substrate can be a crystalline substrate having a lattice constant closely matched to a lattice constant of the metal oxide. The substrate can have a lattice constant that differs by less than 10%, less than 8%, less than 6%, less than 4%, less than 2%, or less than 1% from a lattice constant of the metal oxide. The lattice mismatch between the nanostructure and the substrate can be less than 5%, less than 4%, less than 3%, less than 2%, less than 1.5%, less than 1%, less than 0.9%, or less than 0.8%.

The nanostructures can be made from or can contain metal oxides. The nanostructures can be pure metal oxide nanostructures or can be doped metal oxide nanostructures. The term "pure metal oxide" refers to metal oxides substantially free of impurities, dopants, and other materials. The pure metal oxide contains at least 90%, at least 95%, at least 99%, at least 99.5%, or at least 99.9% metal oxide. The term "pure metal oxide" can mean an X-ray diffraction spectra of the nanostructure that does not reveal any peaks and does not show a peak shift other than those corresponding to the metal oxide and, optionally, those corresponding to the substrate. The nanostructure, doped or un-doped, can be substantially pure; meaning the nanostructure contains only the metal oxide, the one or more dopants if doped, and less than 5%, less than 3%, less than 1%, less than 0.5%, or less than 0.1% of other materials or impurities.

An oxide is a material or chemical composed of oxygen and at least one additional element. In metal oxides the oxygen generally has an oxidation state of −2. Examples of oxides can include silicon dioxide, iron oxide, aluminum oxide, zinc oxide, or calcium oxide. The term "metal oxide" although used herein in the singular tense, is meant to include the single oxides such as silica, alumina, or zinc oxide as well as plural and complex oxides such as silica-alumina, silica-alumina-thoria, zeolites and clays. In some embodiments, metal oxides have surface groups such as surface hydroxyl groups or surface oxyhydroxyl groups. The metal oxide can be a metal oxide semiconductor such as zinc oxide, titanium dioxide, copper oxide, bismuth trioxide, tin dioxide, lanthanum copped oxide, iron oxide, nickel oxide, or europium oxide. The metal oxide can be an In-containing, Zn-containing, Sn-containing, Hf-containing, or Ga-containing oxide. Specific examples of suitable oxides include indium gallium zinc oxide (InGaZnO), indium zinc oxide (InZnO), indium hafnium zinc oxide (InHfZnO), indium tin zinc oxide (InSnZnO), tin zinc oxide (SnZnO), indium tin oxide (InSnO), gallium zinc oxide (GaZnO), and zinc oxide (ZnO). The metal oxide can contain indium, tin, zinc, hafnium, gallium, titanium, niobium, tantalum, or tungsten.

The metal oxide can be a zinc oxide. The term "zinc oxide" refers broadly to oxides containing primarily zinc and oxygen in an approximately 1:1 Zn:O ratio, e.g. at least about 70%, 75%, 80%, 85%, 90%, 95%, or 99% of the composition is ZnO having a Zn:O ratio of between 0.8:1 and 1.2:1, between 0.9:1 and 1.1:1, or between 0.95:1 and 1.05:1. Zinc oxides can include doped zinc oxides, e.g. those containing one or more dopants. Suitable dopants can include n-type dopants or p-type dopants as described below.

The metal oxide can be doped or un-doped. The metal oxide can include one, two, three, four, or more dopants. The dopants can be a p-type dopant or an n-type dopant. Suitable p-type dopants can include Na, K, Te, Tl, As, Ag, or B. Suitable n-type dopants can include Al, Ga, Gd, Sb, Bi, Pb, As, Y, Sc, or P. The dopant can be a transition metal, e.g. Mn, Co, V, Ni, Fe, or Sc. The dopant can be a rare earth lanthanide, e.g. La, Ce, Pr, Nd, Pm, Sm, Eu, Gd, Tb, Dy, Ho, Er, Tm, Yb, Lu, Sc, or Y. In some embodiments, the dopant is gadolinium. The dopant can be present at any concentration necessary to obtain the desired electrical and/or optical properties. The dopant can be present at a concentration by weight of between 0.001%-20%, 0.01%-20%, 0.01%-15%, 0.05%-15%, 0.1%-15%, 0.1%-10%, 0.1%-5%, 0.5%-5%, or 0.5%-2.5%. The metal oxide can be lightly doped, e.g. having a dopant concentration by weight of less than 5%, less than 4%, less than 3%, less than 2%, or less than 1%. The metal oxide can be highly doped, e.g. having a dopant concentration by weight of greater than 5%, greater than 6%, greater than 7%, greater than 8%, greater than 9%, greater than 10%, or greater than 15%.

The nanostructures can be used in a variety of devices, for example as light harvesting, light emitting, or conductive structures. The nanostructures can be on a transparent substrate and can be used as a transparent electrode. The nanostructures can be used in nanoelectronics, nano-optoelectronics, nanopiezotronics, gas/chemical sensors, transparent electrodes, and field emission devices. The nanostructures can achieve high field emission current density at a low field because of their high aspect ratio. The nanostructures can improve the light trapping and charge separation in nanowire-polymer solar cells.

II. Synthesis of Metal Oxide Nanostructures

The metal oxide nanostructures described above are not limited to being made by a specific method. However, in some embodiments methods of making the nanostructures using a pulsed laser deposition (PLD) are provided. The methods can result in nanostructures that are vertically-aligned, well-defined, and/or reproducibly deposited on the substrate. Nanostructures are said to be "reproducibly deposited" when, for a given set of deposition conditions, the resulting nanostructure features are essentially unchanged, e.g. do not change by more than 5%, 4%, 3%, 2%, or 1%, between depositions.

In some embodiments the method includes providing a target containing one or more metal oxides or a precursor thereof. The metal oxide or metal oxide precursor can be generally of any purity, although those having a purity of at least 90%, 95%, 98%, 99%, 99.5%, or 99.9% are used in some embodiments. The target can also contain one or more dopants or dopant precursors. The dopant precursor can be, for example, an alkaline earth oxide or a rare earth oxide, where the dopant is therefore the alkaline earth metal or the rare earth metal ion. The dopant can, likewise, be of any purity although, in some embodiments, the dopant has a purity of at least 90%, 95%, 98%, 99%, 99.5%, or 99.9%.

The method can include ablating the target. The ablation can generally be accomplished by any method, e.g. the target can be thermally ablated or non-thermally ablated. In some embodiments the target is ablated using radiation from a light source. The light source can be an infrared light source that thermally ablates the target. The light source can be an ultraviolet light source. In some embodiments the target is ablated using an ultraviolet (UV) laser. In some embodiments the UV laser is a pulsed UV laser. The ablation with a UV laser can, in some embodiments, be non-thermal.

The pulsed UV laser can be an excimer laser. The terms "excimer laser" and "exciplex laser" are used interchangeably herein to refer to lasers that produce radiation by the emission from an excited complex, typically a gas discharge laser containing a noble gas and a halogen gas. Commonly used excimer lasers include Argon-Fluoride, Krypton-Fluoride, Xenon-Chloride, and Xenon-Fluoride lasers. The laser can produce radiation having a wavelength of 150-400 nm, 150-350 nm, 150-300 nm, 200-300 nm, 240-260 nm, or others. The laser can be a violet laser, an ultraviolet laser, a near ultraviolet laser, or a deep ultraviolet laser.

The laser can be a pulsed laser. The laser can have any pulse rate adjusted to provide the desired ablation of the target and/or adjusted to make nanostructures having the desired properties. The laser can have a pulse rate from 1 Hz to 1,000 Hz or even 10,000 Hz. The laser can have a pulse rate of 1-500 Hz, 5-500 Hz, 5-250 Hz, 5-200 Hz, 5-150Hz, 5-100 Hz, 5-50 Hz, 5-20 Hz, or others. In one or more aspects the number of laser pulses can be set to 10,000-60,000, 20,000-40,000, 35,000-45,000, or others. The pulse width of the laser will generally range from about 1 ns to about 100 ns, e.g. about 2-100 ns, 2-50 ns, 2-20 ns, or others. The laser can be adjusted to produce any energy density on the target to give the desired level of ablation. The energy density can be, for example, up to 5, 10, 20, 30, 40, or 100 J/cm$^2$. The energy density can be about 0.5-100, 0.5-50, 0.5-30, 0.5-20, 0.5-10, 2-10, 3-10 J/cm² or others. In various aspects the laser energy density can be 0.7-1.7 J/cm², 2-3 J/cm², or 4-6 J/cm².

The method can include depositing the metal oxide from the plume onto a substrate to form the nanostructures. The substrate can generally be any suitable substrate on which the nanostructures can be deposited. The substrate need not contain a seed catalyst to deposit the nanostructure. In some embodiments the substrate does not contain a seed catalyst. In some embodiments the substrate is free of seed catalysts prior to the deposition step. Examples of suitable substrates are described above. In one or more aspects the substrate is selected such that the surface energy of the substrate exceeds the combination of both the surface energy of the deposit and the interfacial energy between the substrate and deposit:

$$\gamma_{sv} > \gamma_{fs} + \gamma_{vf}$$

Where $\gamma_{sv}$, $\gamma_{fs}$, and $\gamma_{vf}$ are the surface energy of substrate-vapor, deposit-substrate, and vapor-deposit. This mode of growth is known as Stranski-Krastonov growth.

The substrate can be generally positioned at any distance or orientation with respect to the target so that the metal oxide is deposited onto the substrate. In some embodiments the substrate is positioned above the target during the deposition step. The substrate is said to be positioned "above" or "over" the target when the center of mass of the substrate is above an imaginary horizontal plane encompassing the center of mass of the target. The substrate can be "immediately above" the target, i.e. the center of mass of the substrate can be 90° out of plane with respect to the horizontal plane encompassing the center of mass of the target. The substrate positioned above the target can have a center of mass more than 15°, 30°, 45°, 55°, 65°, 75°, 80°, 85°, or 87° out of plane with respect to the horizontal plane encompassing the center of mass of the target. In one or more aspects the target is oriented with respect to the substrate such that the angle of travel of ions resulting from the target ablation to the substrate is substantially vertical. This is contrary to most pulsed laser deposition (PLD) systems in which the angle of ion travel is generally horizontal.

The distance between the target and the substrate can be adjusted as necessary to obtain the desired deposition rate or nanostructure properties. The distance between the target and the substrate can be less than about 100, 90, 80, 70, 60, 50, 40 30, 20, or 15 cm. For example, the distance between the target and the substrate can be about 1-20 cm, 1-18 cm, 2-18 cm, 2-16 cm, 2-15 cm, 5-15 cm, 5-12 cm, 8-12 cm, or others. In one or more aspects the distance between the target and the substrate can be greater than 6 cm. For example it can be 8 cm-10 cm.

The time, temperature, and/or pressure during the deposition can be adjusted to obtain the desired nanostructure properties. The deposition can be performed over a period of seconds, minutes, or hours. The deposition can be performed for up to 10, 20, 30, 40, 60, 90, 120, 180 minutes or others. The deposition can be performed for a period of time about 10-120 minutes 10-100 minutes, 20-100 minutes, 30-100 minutes, 30-90 minutes, 40-80 minutes, 40-60 minutes, or others.

The deposition can be performed in a chamber. The target and the substrate can be placed in the chamber under a vacuum, under oxygen, or under an inert gas. Inert gases can include nitrogen gas or a noble gas. The deposition can be performed at a pressure less than 5 Torr, 4 Torr, 3 Torr, 2 Torr, or 1 Torr. The deposition can be performed at a pressure less than 1,000 mTorr, 900 mTorr, 800 mTorr, 700 mTorr, 600 mTorr, 500 mTorr, 450 mTorr, 400 mTorr, 350 mTorr, 300 mTorr, 250 mTorr, 200 mTorr, or others. The deposition can be performed at a pressure of about 20-1,000, 20-800, 50-800, 500-600, 50-500, or 50-400 mTorr or others. In one or more aspects the pressure in the chamber can be 50 mTorr to 200 mTorr.

The deposition step can be performed at a temperature of less than 2,000° C., less than 1,500° C., less than 1,000° C., or less than 800° C. The deposition step can be performed at a temperature of about 200-1,000° C., 200-900° C., 300-900° C., 400-900° C., 400-800° C., 500-800° C., 600° C.-700° C. or others. In one or more aspects the temperature in the chamber can be 650° C.±20° C.

In one or more embodiments a method of making metal oxide nanostructures is provided. In one or more other embodiments a method of making a device comprising metal oxide nanostructures is provided. The methods can include the steps of providing a target comprising a metal oxide, such as described above, and providing a substrate, such as described above. The target and the substrate can be placed in a chamber. The target can be positioned below the substrate. In one or more aspects the distance between the target and the substrate can be greater than 6 cm, for example the distance can be 8-10 cm. The chamber can be evacuated to control the pressure and the atmosphere in the chamber, as described above. The methods further include the steps of ablating the target with a laser, such as described above, to create a plume containing the metal oxide, and depositing the metal oxide from the plume onto the substrate to produce the metal oxide nanostructures. In one or more aspects the target can be positioned below the substrate such that the angle of ion travel of the ablated metal oxide target to the substrate is substantially vertical. The depositing step can be performed at a pressure of 1 Torr or less, preferably about 500 mTorr or less. In a non-limiting example the depositing step can be performed at a pressure of 50 mTorr-200 mTorr. The depositing step can be performed at a temperature of 500° C.-800° C., for example 600° C.-700° C. In a non-limiting example the depositing step can be performed at a temperature of 650° C.±20° C. After depositing the metal oxide onto the substrate to produce the metal oxide structures, the chamber can be backfilled and the structures can be cooled. As a non-limiting example the chamber can be backfilled with 100 Torr of oxygen and the metal oxide structures cooled to room temperature at a rate of about 10° C./min.

In one or more embodiments, the target can be a compressed and sintered powder of doped or un-doped metal oxide. The target can be of various sizes. As a non-limiting example, the target can be of a diameter of 1 inch. If doped, the dopant can be a powder mixed with the host metal oxide and the dopants can be selected from the group consisting of alkaline earth metals and rare earth metals. As a non-limiting example the dopant can be gadolinium, preferable in substantially pure form. The dopant can constitute 10% or less by weight of the total mixture of target and dopant, for example 1% or less by weight of the total mixture. In a non-limiting example the dopant can be 0.5% by weight, or even 0.25% by weight or less of the total mixture.

III. Definitions

The terms "nanometer range" or "nm range", as interchangeably used herein, refer to a range of dimensions from about 0.1 nm to about 1,000 nm, e.g. about 1-1,000 nm, 10-1,000 nm, 10-900 nm, 10-800 nm, 10-750 nm, 10-700 nm, 10-650 nm, 10-600 nm, 20-600 nm, 20-500 nm, 50-500 nm, 50-450 nm, 50-400 nm, 50-350 nm, 50-250 nm, 75-250 nm, 100-250 nm, or about 100-200 nm.

The terms "micrometer range", "μm range", or "micron range", as interchangeably used herein, refer to a range of dimensions from about 0.1 micrometer ("μm") to about 1,000 μm, such as from about 0.1 μm to about 500 μm, from about 0.1 μm to about 100 μm, from about 0.1 μm to about 50 μm, or from about 0.1 μm to about 10 μm.

The term "well-defined", as generally used herein, refers to nanostructures that are well-separated, distinguishable with a clear hexagonal structure, have a uniform shape distribution, and/or have a uniform size distribution. Nanostructures are said to be "well-separated" when the nearest neighbor distance between adjacent nanostructures is on average at least 10 nm, 20 nm, 30 nm, 40 nm, 50 nm, or at least 100 nm. Nanostructures are said to be "distinguishable" when the shape, size, location, and/or orientation of the nanostructure on the substrate are discernible from scanning electron micrograph (SEM) images of the nanostructures on the substrate. Nanostructures are said to have a "uniform shape distribution" when each of the nanostructures in a plurality of nanostructures has similar shape based upon one or more shape-based measures being within a narrow range for each nanostructure in the plurality of nanostructures. The shape-based measures may include an aspect ratio, a roughness, a roundness, a length, and/or a width. For example, a collection of nanostructures is said to have a uniform shape distribution when about 40% or more, about 50% or more, about 60% or more, about 70% or more, or about 80% or more of the nanostructures have one, two, three, or more shape-based measures that differ by not more than 5%, 10%, or 20% from the average of the shape-based measure for the collection of nanostructures. Nanostructures are said to have a "uniform size distribution" when, for a plurality of nanostructures, the nanostructures size scatter is within a narrow range of sizes. A collection of nanostructures having a uniform size distribution can be a collection of nanostructures having a span of about 2 or less, about 1 or less, about 0.8 or less, or about 0.5 or less. A collection of nanostructures having a uniform size distribution can be a collection of nanostructures having a coefficient of variance of about 0.5 or less, about 0.4 or less, or about 0.3 or less. A collection of nanostructures having a uniform size distribution can be a collection of nanostructures wherein about 40% or more, about 50% or more, about 60% or more, about 70% or more, or about 80% or more of the nanostructures have a size that is within ±10 nm, ±8 nm, ±6 nm, ±5 nm, or ±3 nm of the average size for the collection of nanostructures.

The term "vertically-aligned", as generally used herein, can refer to the orientation of a single nanostructure or to the orientation of a plurality of nanostructures on a surface, for example on a substrate surface. A single nanostructure is said to be vertically-aligned on a surface if the long axis of the nanostructure is substantially parallel to the surface normal. A plurality of nanostructures is said to be vertically-aligned on a surface if a majority of the nanostructures are vertically aligned, e.g. at least 70%, at least 80%, at least 90%, at least 95%, or at least 99% of the nanostructures are vertically aligned. The "long axis" of a nanostructure is the imaginary line that runs parallel to the longest length of the nanostructure and intersects the geometric center of the nanostructure. The long axis is said to be "substantially parallel" to the surface normal when the long axis is either parallel to the surface normal, i.e. the long axis either does not intersect or is co-linear with the surface normal, or when the long axis intersects the surface normal at an angle of less than 45°, less than 40°, less than 35°, less than 30°, less than 25°, less than 20°, less than 15°, or less than 10°.

The term "size" means one or more measures of the geometric dimensions of a nanostructure and can include, for example, the length, width, diameter, radius, circumference, or any other suitable measure of the dimensions of the nanostructure. The size distribution of a collection of nanostructures can be characterized by several values. The term "average size" and "average diameter" mean the number average of the sizes of a collection of nanostructures.

The "span" for a distribution of sizes can be computed from the formula $$\text{Span} = \frac{D_{v0.9} - D_{v0.1}}{D_{v0.5}};$$

where $D_{v0.1}$, $D_{v0.5}$, and $D_{v0.9}$ are defined such that 10%, 50%, and 90% of the nanostructures in the collection of nanostructures have a dimension smaller than $D_{v0.1}$, $D_{v0.5}$, and $D_{v0.9}$ respectively.

The coefficient of variation (COV) for a collection of nanostructures is the standard deviation of particle sizes divided (normalized) by the average particle size.

The term "aspect ratio", as used herein with regard to the shape of a nanostructure, refers to any one of many different ratios of a major (long) diameter and a minor (short) diameter as measured for the particle. The aspect ratio can include the ratio of the longest diameter and the shortest diameter of the nanostructure, the ratio of the longest diameter and the shortest diameter in the direction perpendicular to the longest diameter, the ratio of the shortest diameter and the longest diameter in the direction perpendicular to the shortest diameter, and reciprocal ratios thereof. The term "roughness", as used herein with regard to the shape of a nanostructure, refers to the ratio of the convex perimeter to the perimeter of the nanostructure as obtained by TEM images.

The term "lattice mismatch", as used herein, refers to a percent difference between the lattice constants of the nanostructures with respect to the lattice constants of the substrate. For cubic lattices, the lattice mismatch can be computed, for example, by taking the difference between the lattice constant of the metal oxide and the lattice constant of the substrate normalized by the lattice constant of the substrate. The lattice mismatch is normally reported as a percent mismatch. When one or more lattices are not cubic, the lattice mismatch can be taken, for example, as an average mismatch over each of the lattice dimensions in the plane of the substrate, i.e. each of the lattice dimensions in the interfacial plane between the nanostructure and the substrate.

The terms "dopant" and "doping agent", as interchangeably used herein, refer to any one or a number of trace elements that can be inserted into a substance, generally in very low concentrations, in order to alter the electrical and/or optical properties of the substance. In doping of crystalline or semi-crystalline materials, the dopant is generally an atom that takes the place of an atom in the crystal lattice or in interstitial position in the crystal. With respect to semiconductors, dopants can be added to shift the Fermi levels in the material to produce materials that have predominately negative (n-type) or positive (p-type) carries. The term "n-type" dopant, as generally used herein, refers to a dopant that produces negatively charged (n-type) carriers in the material. The term "p-type" dopant, as generally used herein, refers to a dopant that produces positively charged (p-type) carriers in the material. The classification of a dopant as p-type or n-type can be dependent upon the specific material, e.g. the specific metal oxide, being doped as the ability of a dopant to produce n-type carriers or p-type carriers is dependent upon both the energy levels of the dopant and the material being doped.

When referring to radiation, as used herein, the term "visible" refers to radiation having a wavelength of about 300-800 nm, about 325-750 nm, about 350-740 nm, or about 370-720 nm; the term "ultraviolet" or "UV" refers to radiation having a wavelength of about 150-450 nm, about 170-400 nm, about 190-350 nm, or about 200-300 nm; and the term "infrared" or "IR" refers to radiation having a wavelength of about 0.7-1,000 μm, about 0.7-50 μm, about 0.74-14 μm, about 0.75-8 μm, or about 0.75-5 μm. The radiation can be described herein as "near ultraviolet" or "near UV" when the wavelength of the radiation is about 290-430 nm, about 300-400 nm, about 310-395 nm, or about 320-380 nm. The radiation can be described herein as "deep ultraviolet" or "deep UV" when the wavelength of the radiation is about 150-320 nm, about 185-310 nm, or about 200-300 nm. The radiation can be described herein as "violet" if it has a wavelength of about 300-450 nm, about 325-440 nm, about 350-430 nm, or about 360-420 nm; as "indigo" if it has a wavelength of about 400-480 nm, about 420-460 nm, about 430-450 nm, or about 440 nm; as "blue" if it has a wavelength of about 430-520 nm, about 440-510 nm, about 450-500 nm, or about 460-490 nm; as "cyan" if it has a wavelength of about 480-540 nm, about 490-530 nm, about 500-520 nm, or about 501 nm; as "green" if it has a wavelength of about 500-600 nm, about 510-580 nm, about 520-565 nm, or about 540-550 nm; as "yellow" if it has a wavelength of about 540-610 nm, about 550-600 nm, about 564-590 nm, or about 589 nm; as "orange" if it has a wavelength of about 570-650 nm, about 580-640 nm, about 590-625 nm, or about 593 nm; and as "red" if it has a wavelength of about 600-800 nm, about 610-780 nm, about 625-740 nm, or about 650-720 nm. The radiation can be described herein as "near infrared" or "NIR" if it has a wavelength of about 700-3,000 nm, about 740-1,400 nm, or about 750-1,000 nm; as "short-wave infrared" or "SWIR" if it has a wavelength of about 850-2,000 nm, about 900-1,700 nm, or about 1,000-1,400 nm; as "medium-wave infrared" or "MWIR" if it has a wavelength of about 2-8 μm, about 3-5 μm, or about 3.5-4.5 μm; and as "long-wave infrared" or "LWIR" if it has a wavelength of about 7-14 μm, about 8-12 μm, or about 9-10 μm.

Where a range of values is provided, it is understood that each intervening value, to the tenth of the unit of the lower limit unless the context dictates otherwise, between the upper and lower limit of that range and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both are also included in the disclosure.

Ratios, concentrations, amounts, and other numerical data may be expressed in a range format. It is to be understood that such a range format is used for convenience and brevity, and should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt % of the mixed powder, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, the term "about" can include traditional rounding according to significant figures of the numerical value. In addition, the phrase "about 'x' to about 'y'" includes "about 'x' to about 'y'".

Unless defined otherwise, all technical and scientific terms used have the same meaning as commonly understood by one of ordinary skill in the art to which this disclosure belongs. Although any methods and materials similar or equivalent to those described can also be used in the practice or testing of the present disclosure, the preferred methods and materials are now described.

All publications and patents cited in this specification are incorporated by reference as if each individual publication or patent were specifically and individually indicated to be incorporated by reference and are incorporated by reference to disclose and describe the methods and/or materials in connection with which the publications are cited. The citation of any publication is for its disclosure prior to the filing date and should not be construed as an admission that the present disclosure is not entitled to antedate such publication by prior disclosure. Further, the dates of publication provided could differ from the actual publication dates that may need to be independently confirmed.

As will be apparent to those of skill in the art upon reading this disclosure, each of the individual embodiments described and illustrated has discrete components and features which may be readily separated from or combined with the features of any of the other several embodiments without departing from the scope or spirit of the present disclosure. Any recited method can be carried out in the order of events recited or in any other order logically possible.

Embodiments of the present disclosure will employ, unless otherwise indicated, techniques of molecular biology, microbiology, nanotechnology, organic chemistry, biochemistry, botany which are within the skill of the art. Such techniques are explained fully in the literature.

EXAMPLES

Now having described the embodiments of the present disclosure the following Examples describe some additional embodiments of the present disclosure. While embodiments of the present disclosure are described in connection with the following examples and the corresponding text and figures, there is no intent to limit embodiments of the present disclosure to this description. The intent is to cover all alternatives, modifications, and equivalents within the spirit and scope of embodiments of the present disclosure.

Example 1

Synthesis of Gd-Doped ZnO Nanowires on a-Sapphire

The conditions of the synthesis and the depositions are as follows: the PLD target was prepared conventionally by mixing (99.75 wt %) ZnO (99.999% pure) and (0.25 wt %) $Gd_2O_3$ (99.99% pure) powder. For PLD deposition, we used Excimer laser KrF with 248 nm wavelength. Laser frequency, target substrate vertical distance, laser beam power, and laser energy density on target were fixed at 10 Hz, 9±1 cm, and 5±1 J/cm² respectively. The chamber was evacuated to a background pressure of $1\times10^{-6}$ Torr, and we changed the partial oxygen pressure (P(O$_2$)) to 15, 25, 50, 100, and 200 mTorr. We used Al$_2$O$_3$ (11$\overline{2}$0) substrate held inside a chamber at a fixed temperature of 650° C. For all the experiments, we optimized the number of pulses incident on the target, which was set at 30,000 pulses. After the deposition, the chamber was backfilled with 100 Torr oxygen, and the samples were cooled to room temperature (10° per minute).

Scanning Electron Microscope (SEM) examinations showed that the Gd—ZnO produced at P(O$_2$)=15 and 25 mTorr closely resembled continuous film and very slight density of nanostructures. On the other hand, the samples deposited at P(O$_2$)=50, 100, and 200 mTorr are characterized by high density of well-aligned vertical ZnO nanowires and their density increases with the pressure. The selective SEM images of Gd—ZnO structure grown at P(O$_2$)=50 mTorr (FIGS. 1A and 1B), 100 mTorr (FIGS. 1C and 1D), and 200 mTorr (FIGS. 1E and 1F). The NW length achieved is around 300 nm and the diameters are in 60-100 nm range.

Figure 2:
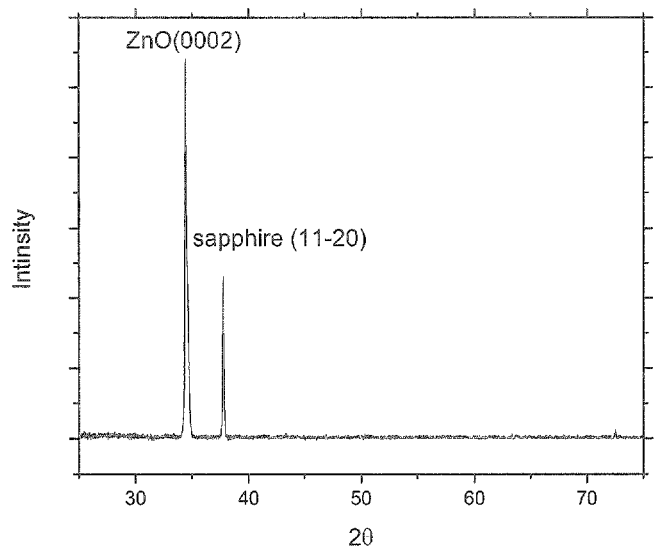
FIG. 2 is an X-ray diffraction (XRD) spectrum of Gd-doped Zinc oxide (ZnO) nanowires deposited at oxygen partial pressure of 200 mTorr.

The x-ray pattern of the ZnO nanowires shown in FIG. 2 has been grown on a-sapphire at 200 mTorr, and the ZnO nanowires show strong peaks corresponding to (0002) ZnO planes, indicating that these are single-crystal well aligned vertical ZnO nanowires grown along the c-axis.

Figure 3:
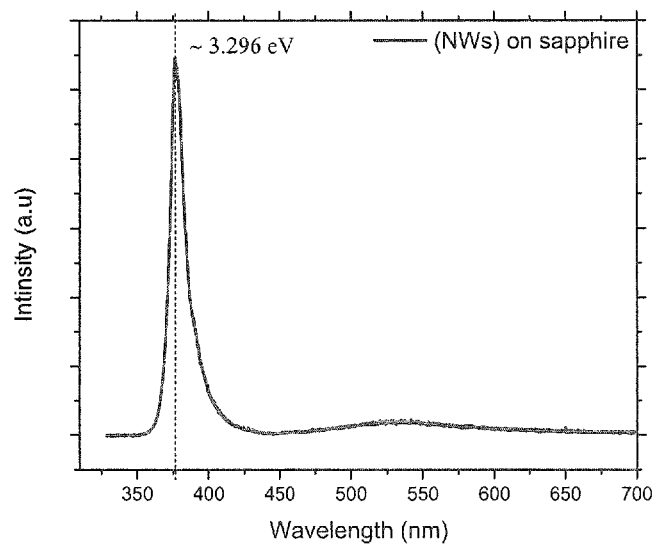
FIG. 3 is a room temperature photoluminescence spectrum of the Gd-doped Zinc oxide (ZnO) nanowires deposited at oxygen partial pressure of 200 mTorr.

We also carried out room temperature photoluminescence (PL) measurements of the nanowires of FIG. 2, as shown in FIG. 3. The PL spectrum of all samples confirmed that these are high quality ZnO materials that can be suitable for electronic and optoelectronic application, as no intense deep-level defect bands is observed at green-red spectral regions. The strong and sharp main band edge emission at λ=376.18 nm, 3.296 eV, at room temperature, indicates a high crystalline structure of the ZnO.

Example 2

Synthesis of ZnO Nanowires and Nanotubes on Silicon

Conditions for growing pure ZnO nanowires (NWs) and nanotubes (NTs) on silicon (Si) were determined. This would lead to more practical and less expensive methodology for Si integrated chips, without the need for long and expensive fabrication processes. Undoped (n-type) ZnO nanowire were deposited on highly conductive Si (100) p-type (to obtain p-n junction as ZnO is n-type material and Si (100) doped with Boron is of p-type), with very low resistivity (0.001-0.005 Ω-cm) by conventional pulsed-laser deposition (PLD) without catalyst or seed layers, as shown in FIG. 4.

ZnO NWs on Si were obtained by changing the PLD conditions very slightly (reducing the laser energy density to 1.2±0.5 J/cm$^2$ on target only) compared to those required for growth on Al$_2$O$_3$. The SEM image of ZnO NWs on silicon obtained at P(O$_2$)=100 mTorr is shown in FIG. 4 and the inset shows the cross-section of the samples. In this case, the NW length and diameter obtained are 150 nm and 60 nm, respectively. By reducing the P(O$_2$) below 100 mTorr, we obtained a separated and well-defined nanowire.

Figure 4:
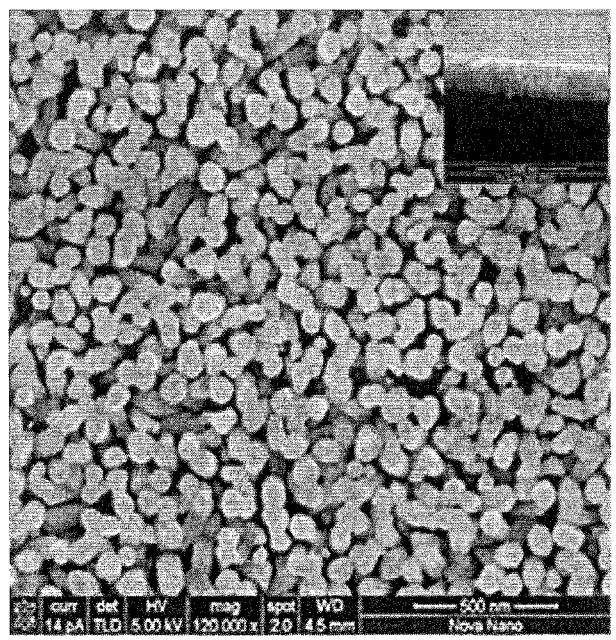
FIG. 4 is a scanning electron microscope (SEM) image of a top view (side view in the inset) of pure Zinc oxide (ZnO) nanowires deposited on silicon substrate at 100 mTorr.
Figure 5:
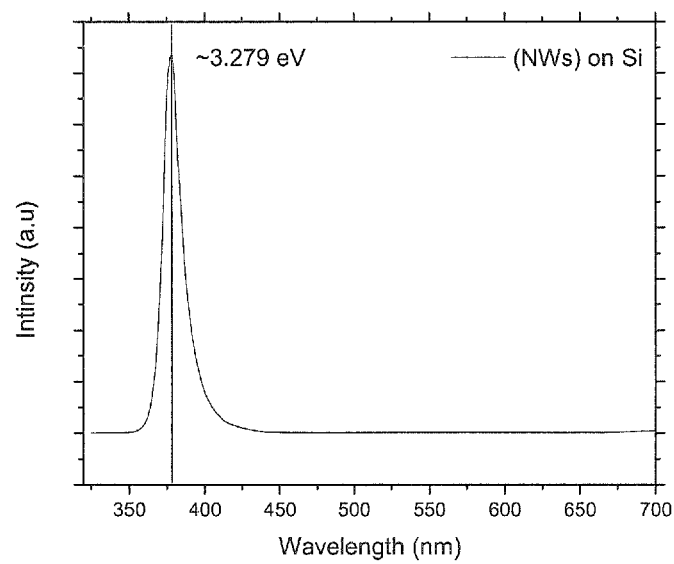
FIG. 5 is a room temperature photoluminescence spectrum of the pure Zinc oxide (ZnO) nanowires deposited on silicon substrate at 100 mTorr.

Room temperature PL measurements were performed to investigate the quality of the nanowires of FIG. 4, as shown in FIG. 5. The strong and sharp main peak at λ=378.13 nm, 3.279 eV, at room temperature, indicates a good crystalline structure of the ZnO. No deep-level defect band is observed in this case.

Figure 6:
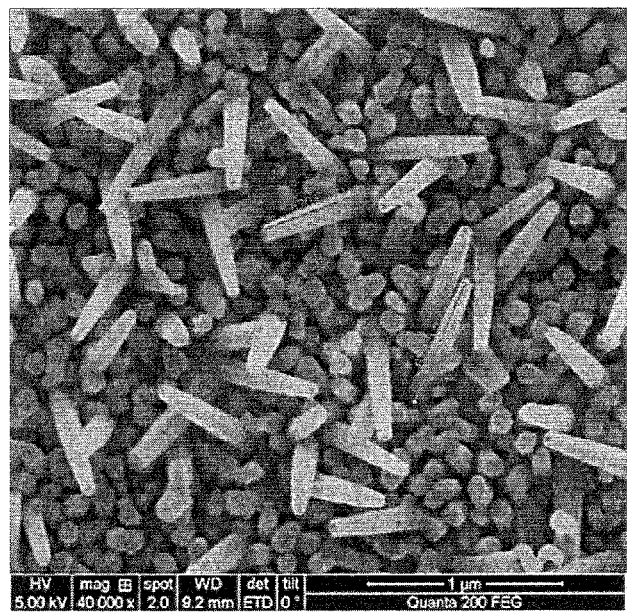
FIGS. 6 and 7 are scanning electron microscope (SEM) images of a top view (FIG. 6) and a side view (FIG. 7) of pure Zinc oxide (ZnO) nanotubes deposited on silicon substrate at 100 mTorr.
Figure 7:
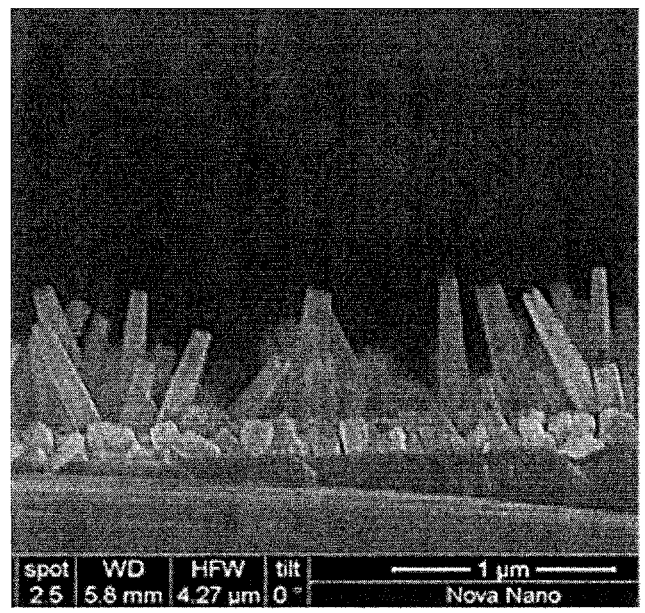
Figure 8:
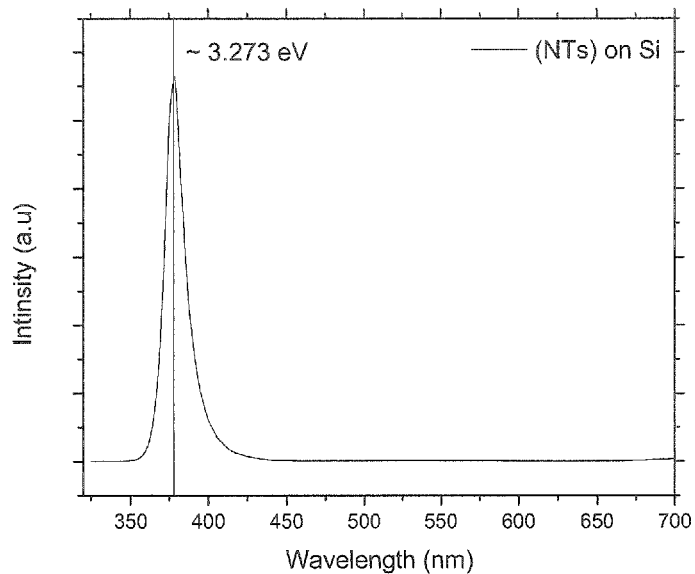
FIG. 8 is a room temperature photoluminescence spectrum of the pure Zinc oxide (ZnO) nanotubes deposited on silicon substrate at 100 mTorr.

ZnO nanotubes (NTs) were also produced on a silicon substrate using similar parameters to grow undoped ZnO NTs on Si by further increasing the laser energy density on target to 2.5±0.5 J/cm$^2$ or the number of laser pulses to 40000±5000 pulses. The SEM image shown in FIG. 6 (top view) depicts ZnO NTs (length ~650 nm, diameter ~60 nm) on silicon obtained at P(O$_2$)=100 mTorr (FIG. 7 shows the cross-sectional view). These novel findings demonstrate that the PLD system has significant potential for application in new technologies. Room temperature PL measurements (FIG. 8) show a strong and sharp band edge peak at λ=378.83 nm, 3.273 eV 378.83 nm, 3.273 eV.

Growth Mechanism

Figure 9:
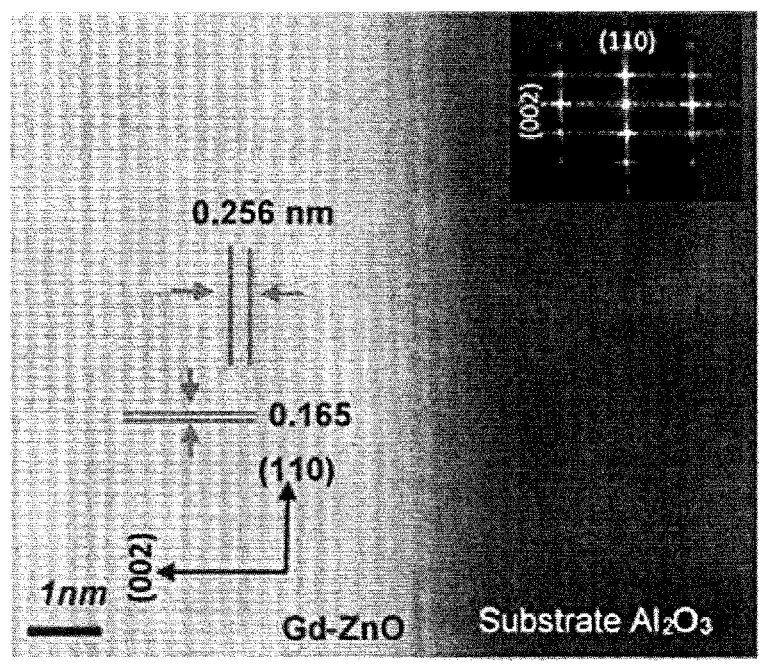
FIG. 9 is an HRTEM image of a vertical cross-section near the interface, with FFT shown in the inset.

To understand the formation mechanism of the self-assembled vertical NWs obtained using the present disclosure, we studied the interface between the substrate and the NWs using high-resolution transmission electron microscopy (Titan-HRTEM). For this purpose, a cross-section was taken along the c-axis near the interface. FIG. 9 shows the corresponding fast Fourier Transform (FFT) pattern near the interface between the substrate and the ZnO NWs. The diffraction pattern corresponds to single-crystal ZnO.

Figure 10:
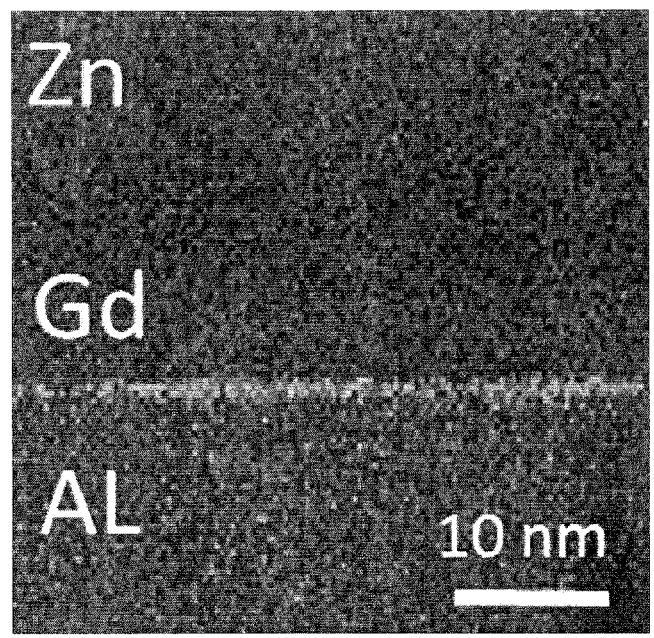
FIG. 10 shows EDS maps of: Gd-L (green, thin middle layer), indicating a uniform interfacial Gd layer between the substrate (the portion below the Gd layer) and the ZnO (the portion above the Gd layer). The compositional map of Zn—K (the portion above the Gd layer) and Al—K (the portion below the Gd layer) are also indicated to show the area near the interface.

FIG. 10 shows energy-dispersive x-ray spectroscopy (EDS) maps of Gd, Zn and Al near the interface. In FIG. 10, it is evident that our method allows formation of a homogeneous well-defined in situ Gd interfacial nanolayer of uniform ultra-thin thickness (~1 nm) deposited on the substrate at the interface between substrate and ZnO NWs during deposition. This Gd nanolayer acts as a uniform layer that assists in the formation of homogeneous nucleation sites on the Gd:ZnO layer that, in turn, stimulates the growth of homogeneous vertical ZnO NWs with well-defined morphologies. In addition FIG. 10 shows a homogenous Zn composition in the film (the portion above the Gd interfacial nanolayer), indicating the good quality of the film. We detect Al composition in the substrate (the portion below the Gd interfacial nanolayer) to demonstrate the interface line.

Figure 11:
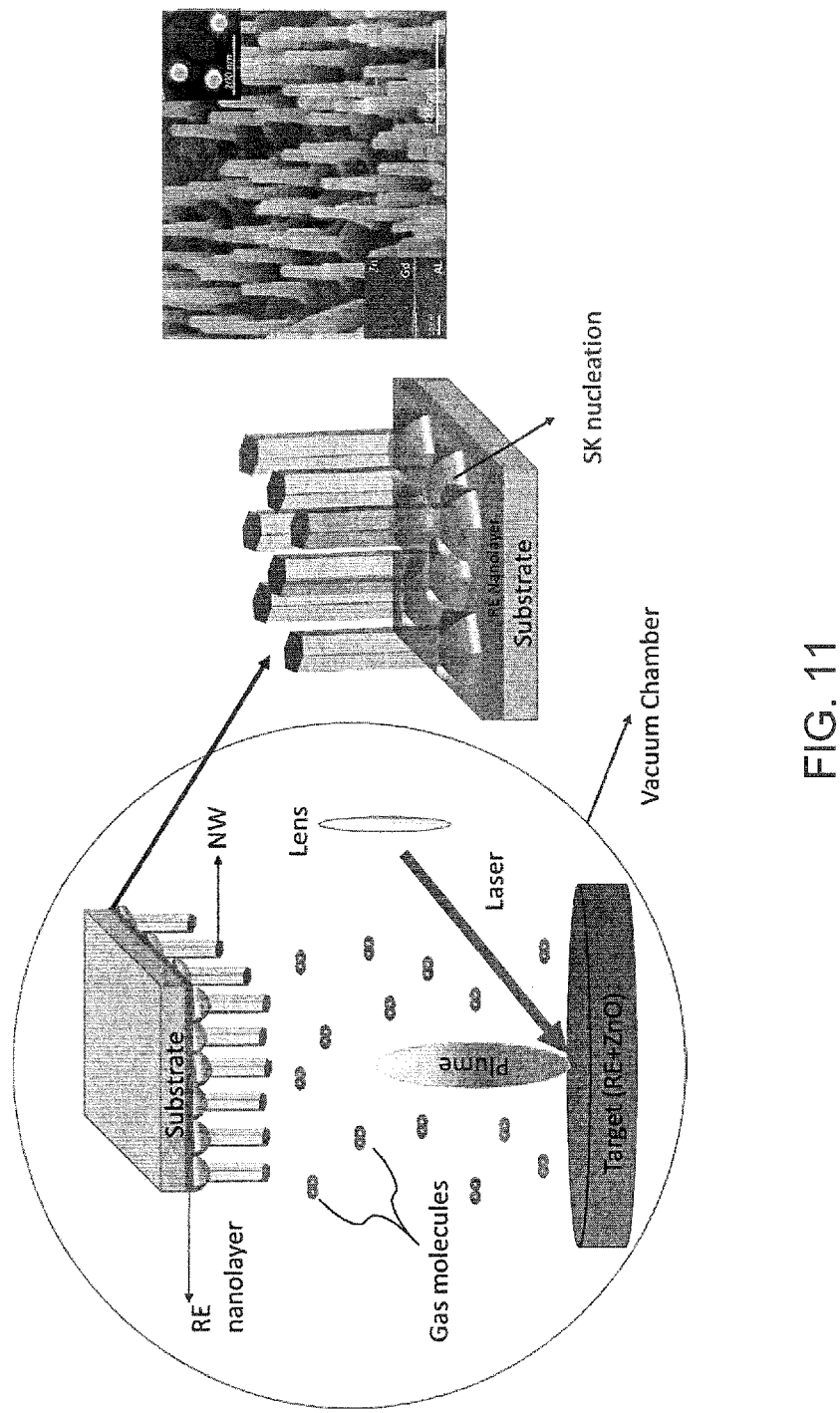
FIG. 11 depicts a schematic diagram for deposition employed in growing vertical NWs (magnified image shows that the RE nanolayer assists in forming SK nucleation and vertical NWs, with corresponding SEM and EDX images).

As previously noted, in the case of undoped ZnO, no nanorods (NRs) are observed on either a or c-Al$_2$O$_3$ substrates due to the absence of Gd dopants. Thus, we posit that, at the beginning of the process, a Stranski-Krastanov (SK) nucleation method takes place to form a 2D wetting layer. This wetting layer strains elastically due to lattice mismatch or presence of a Gd nanolayer. When the stress exceeds a critical point, nucleation will be formed on the interfacial film to decrease the total strain energy, as shown in FIG. 11.

The nucleation is strongly influenced by the surface energy of the free substrate ($\gamma_s$) and the interface between the substrate and the wetting layer; in this case, the Gd nanolayer ($\gamma_i$), the nucleation facet plane ($\gamma_n$), and the contact angle β between the nucleation island and the film correspond to the minimum surface energy. The three surface energy values ($\gamma_s$, $\gamma_i$, $\gamma_n$) depend on the crystallographic orientation of the substrate. In this case, Young's equation can be written in the following form:

$$\gamma_s \geq \gamma_i + \gamma_n \cos \beta$$

The Hall voltage was measured to calculate the carrier density from the Hall resistance (R). We found that R decreases with increasing the magnetic field (B), which is perpendicular to the direction of the current flow, indicating n-type conduction. The electron concentration ($n_e$) is calculated from dR/dB by taking into account the NR geometry. At room temperature (RT), the conductivity ($\sigma_e$) and electron mobility ($\mu_e$) values for these NWs are estimated at 855 S/cm and 177 cm$^2$ (V·s)$^{-1}$, respectively. To the best of our knowledge, these values exceed those that have been previously achieved, based on the available published data for n-type ZnO NWs.

Thus, in one or more aspects, we disclose a novel one-step method, which includes ablating a target containing a metal oxide doped with rare earth (RE) elements by laser beam to create a plume that is deposited on a substrate mounted above the target (FIG. 11). The deposition can generally be performed at any temperature or background gas pressure that is suitable for producing well-defined and/or vertically aligned NWs on the substrate. Our method can produce NWs that are both vertically aligned and well-defined. The NWs can be used in numerous devices, such as transparent electrodes, light-emitting diodes, photovoltaic cells, or chemical sensors.

The deposition does not require high pressures used in other approaches (a few tens of mTorr is sufficient).

The method demonstrates significant improvements in the ability to utilize the rare earth elements as in situ nanolayer to form homogeneous, ideal, well-ordered vertical NWs on a transparent, conductive, uniform nanolayer without using a pre-fabricated template or catalyst (FIG. 11). We confirm that the lattice-matched a-$Al_2O_3$ substrates and the Gd dopants assist in the in situ formation of a uniform Gd interfacial nanolayer, which controls the homogeneity of the ZnO NR structure. This method can be generalized for different materials and different methods as long as we use RE nanolayer above the substrate, as well as it can be used for optoelectronic and electronic devices.

As seen our methods can be employed for producing high quality and conductive NW arrays for light emitting devices, photovoltaic devices, bio and chemical devices, and solar cells. Dye-sensitized solar cells (DSSCs) are among several characteristic photovoltaic devices that have attracted significant attention due to their low cost, simple fabrication and high power efficiency. Although porous $TiO_2$ nanocrystalline film is widely used as the photoanode material of DSSCs, ZnO is an alternative to $TiO_2$, due to its easy crystallization and growth.

When developing this device, it may be desirable to ensure that the surface area of the porous semiconductor film is as large as possible. ZnO NW arrays generally have high surface area, favorable crystallinity and fewer grain boundaries, which could reduce grain-boundary scattering and electron back-reaction with the surrounding electrolyte. Therefore, high-quality ZnO nanowire arrays can promote the conversion efficiency of DSSCs. However, traditional ZnO nanowire arrays used in photoanodes are mostly grown on conductive glass, such as FTO, ITO, AZO films, etc. The crystallinity of those polycrystalline films is considerably inferior compared to that of single crystal. Due to the presence of numerous defects at the interface of the substrate and the NWs, arising from lattice mismatch, the crystallinity and electrical property of ZnO is significantly reduced. Moreover, a photoanode prepared on a polycrystalline film would exhibit lower mobility, as well as much lower chemical and thermal stability. For these reasons, the efficiency of nanowire array DSSCs remains difficult to improve.

Our methods can be used to grow homogeneous, vertical, conductive, and high quality ZnO NW arrays on a conductive and transparent in situ RE nanolayer (in this case Gd) using transparent and single crystal substrate (in this case a-$Al_2O_3$).

Figure 12:
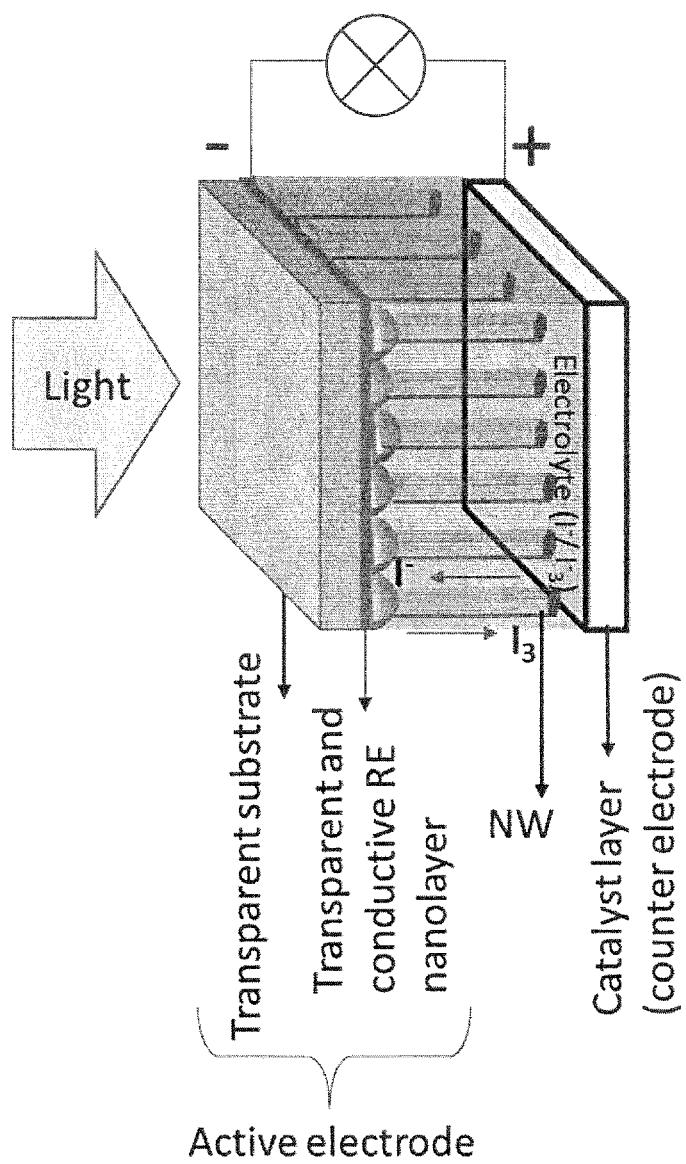
FIG. 12 is a schematic diagram of the ZnO NWs on RE nanolayer-based DSSCs.

FIG. 12 shows a ZnO nanowire array-based DSSCs, with the photoanode prepared using our method. As depicted in FIG. 12, in an embodiment growth on an in situ Gd nanolayer is reported for the first time. It consists of ZnO NWs, an in situ Gd nanolayer near the interface between ZnO NWs and transparent substrate (a-$Al_2O_3$), dye sensitizer, [I—/I3-] electrolyte and a catalyst layer (such as Pt counter electrode), in which the traditional conductive glass has been replaced.

In various aspects, the ZnO NWs used in DSSCs are grown with high carrier mobility and carrier concentration. The application of such nanowire with high conductivity is beneficial, as it improves the electric efficiency. Clearly, our method has notable practical significance. Further, in various aspects, the single crystal orientation of ZnO nanowires is achieved when the single crystal surface serves as the substrate.

It should be emphasized that the above-described embodiments of the present disclosure are merely possible examples of implementations, and are set forth only for a clear understanding of the principles of the disclosure. Many variations and modifications may be made to the above-described embodiments of the disclosure without departing substantially from the spirit and principles of the disclosure. All such modifications and variations are included within this disclosure.

We claim:
1. A method of making metal oxide nanostructures comprising:
providing a target comprising a metal oxide and a dopant;
ablating the target with a laser to create a plume containing the metal oxide and the dopant;
depositing the dopant from the plume onto the substrate to produce a homogeneous dopant interfacial nanolayer of uniform thickness directly on the substrate; and
depositing the metal oxide from the plume onto the dopant interfacial nanolayer to assist in forming homogeneous nucleation sites that stimulate growth of metal oxide nanostructures to produce homogeneous vertically aligned metal oxide nanostructures,
wherein the uniform thickness of the homogeneous dopant interfacial nanolayer is about 1 nm.

2. The method of claim 1, wherein the target and the substrate are provided in chamber and the depositing step is performed within the chamber at a pressure of less than 500 mTorr.

3. The method of claim 1, wherein the depositing step is performed under an oxygen atmosphere or under an inert atmosphere.

4. The method of claim 1, wherein the depositing step is performed at a temperature of 500° C.-800° C.

5. The method of claim 1, wherein the target is positioned below the substrate during the depositing step.

6. The method of claim 1, wherein the distance between the substrate and the target is greater than 6 cm.

7. The method of claim 1, wherein the laser is an excimer laser comprising a noble gas selected from the group consisting of argon, krypton, and xenon and a halogen gas selected from the group consisting of chloride and fluoride.

8. The method of claim 1, wherein the substrate is free of seed catalysts prior to the deposition step.

9. The method of claim 1, wherein the substrate is selected from the group consisting of a crystalline substrate, an amorphous substrate, and a plastic substrate.

10. The method of claim 1, wherein the substrate is selected from the group consisting of a silicon substrate, a sapphire substrate, a quartz substrate, a glass substrate, a polyethylene terephthalate substrate, a polyimide substrate, and a ceramic substrate.

11. The method of claim 1, wherein the substrate is a crystalline substrate having a lattice constant closely matched to a lattice constant of the metal oxide.

12. The method of claim 1, wherein the nanostructures are selected from the group consisting of nanowires, nanorods, and nanotubes.

13. The method of claim 1, wherein the metal oxide is a metal oxide semiconductor.

14. The method of claim 13, wherein the metal oxide semiconductor comprises a metal selected from the group consisting of titanium, tin, niobium, tantalum, tungsten, and zinc.

15. The method of claim 1, wherein the dopant is Gd.

16. The method of claim 1, wherein the dopant is selected from the group consisting of alkaline earth metals and rare earth metals.

\* \* \* \* \*